United States Patent
Kim et al.

(10) Patent No.: US 6,225,820 B1
(45) Date of Patent: May 1, 2001

(54) SEMICONDUCTOR DEVICE HAVING IMPROVED INPUT BUFFER CIRCUIT

(75) Inventors: Jae Woon Kim, Chungcheongbuk-do; Jung Yong Lee, Seoul, both of (KR)

(73) Assignee: Hyundai Micro Electronics Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/383,408

(22) Filed: Aug. 26, 1999

(30) Foreign Application Priority Data

Aug. 26, 1998 (KR) .................................................. 98-34721

(51) Int. Cl.[7] ........................ H03K 19/003; H03K 19/094
(52) U.S. Cl. .............................................. 326/34; 326/121
(58) Field of Search ................................... 326/31, 33–34, 326/112, 119, 121, 83, 86, 87

(56) References Cited

U.S. PATENT DOCUMENTS

| | | | |
|---|---|---|---|
| 4,929,853 | * 5/1990 | Kim et al. | 326/81 |
| 5,239,207 | * 8/1993 | Miyamoto et al. | 327/530 |
| 5,438,280 | * 8/1995 | Sugawara | 326/71 |
| 5,550,486 | * 8/1996 | Sweeney et al. | 326/14 |
| 5,589,783 | * 12/1996 | McClure | 326/71 |
| 5,612,637 | * 3/1997 | Shay et al. | 326/86 |
| 6,087,890 | * 7/2000 | Kim | 327/526 |

* cited by examiner

Primary Examiner—Michael Tokar
Assistant Examiner—James Cho
(74) Attorney, Agent, or Firm—Morgan, Lewis & Bockius LLP

(57) ABSTRACT

An input buffer circuit for a semiconductor device includes a first input buffer unit having first and second transistors, a second input buffer unit coupled to the first input buffer unit, the second input buffer unit having third and fourth transistors, a control unit for activating one of the first and second input buffer units, and a switching unit having fifth, sixth, and seventh transistors and coupled to the control unit.

19 Claims, 7 Drawing Sheets

SEMICONDUCTOR DEVICE HAVING IMPROVED INPUT BUFFER CIRCUIT

This application claims the benefit of Korean Application No. 34721/1998 filed Aug. 26, 1998, which is hereby incorporated by reference.

BACKGROUND OF THE INVENTION

1. Field of the Invention

The present invention relates to a semiconductor device, and more particularly, to a semiconductor device having an improved input buffer circuit. Although the present invention is suitable for a wide scope of applications, it is particularly suitable for maintaining a constant threshold voltage regardless of variation in VCC.

2. Discussion of the Related Art

Figure 1:
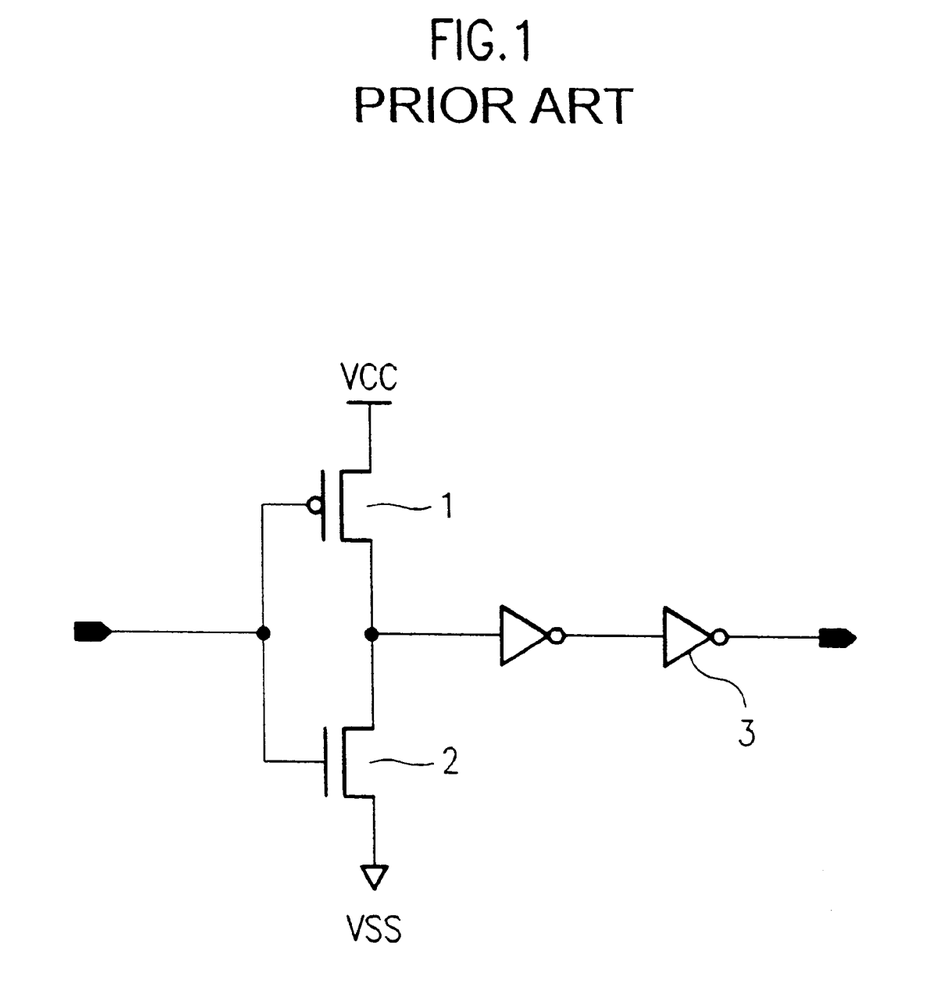
FIG. 1 illustrates a schematic circuit diagram showing a related background art input buffer circuit.
Figure 2:
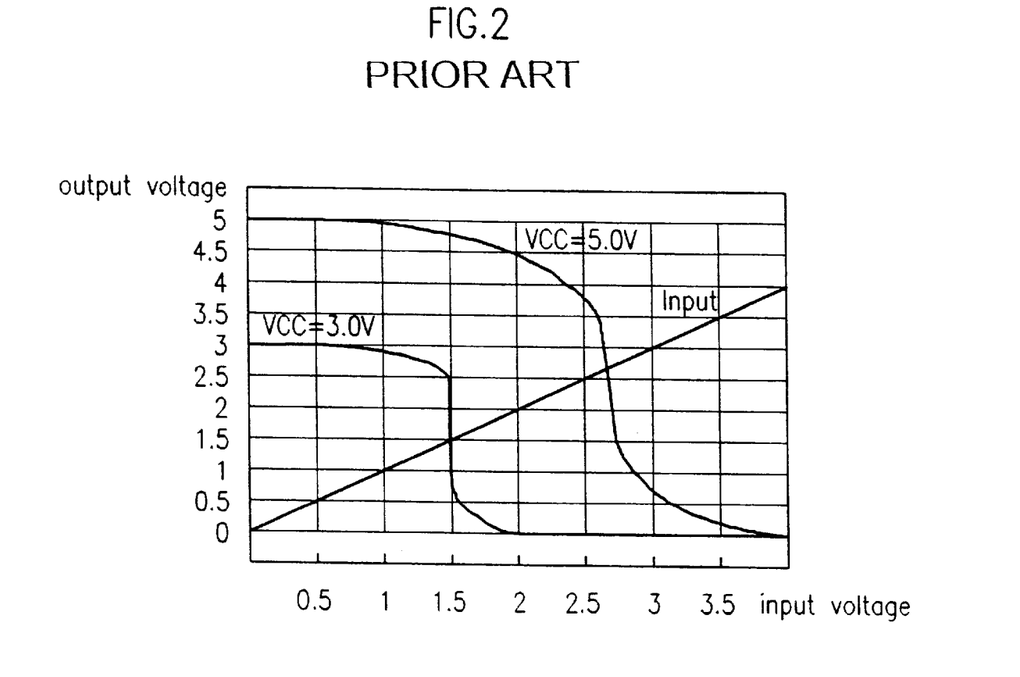
FIG. 2 illustrates a graph showing a DC characteristic of an output voltage in response to an input voltage of an input buffer circuit designed for a VCC of 3.0 V.
Figure 3:
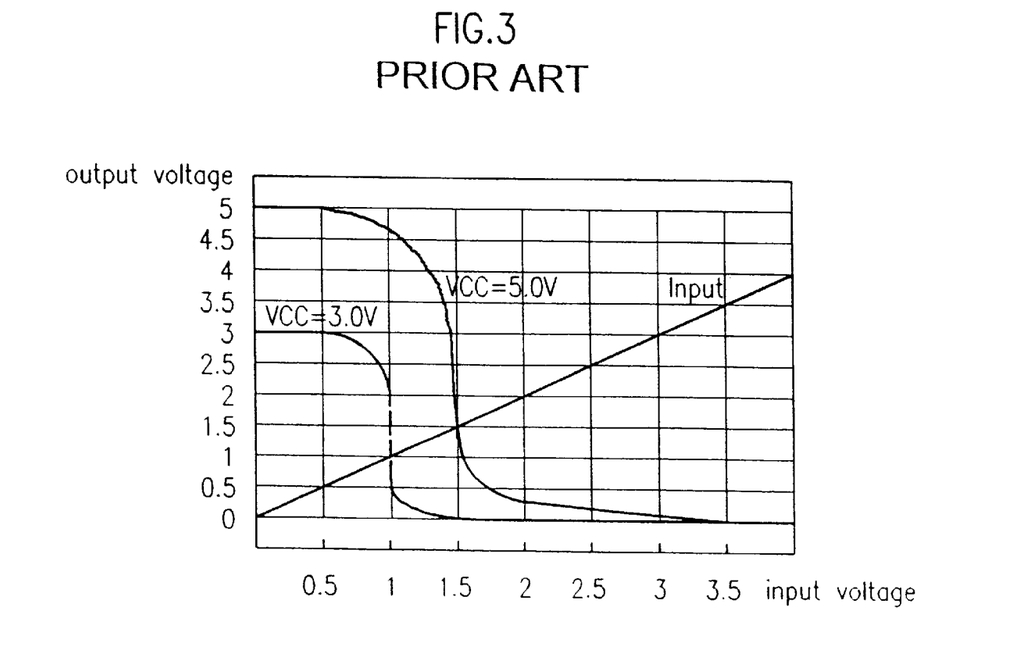
FIG. 3 illustrates a graph showing a DC characteristic of an output voltage in response to an input voltage of an input buffer circuit designed for a VCC of 5.0 V.
Figure 4:
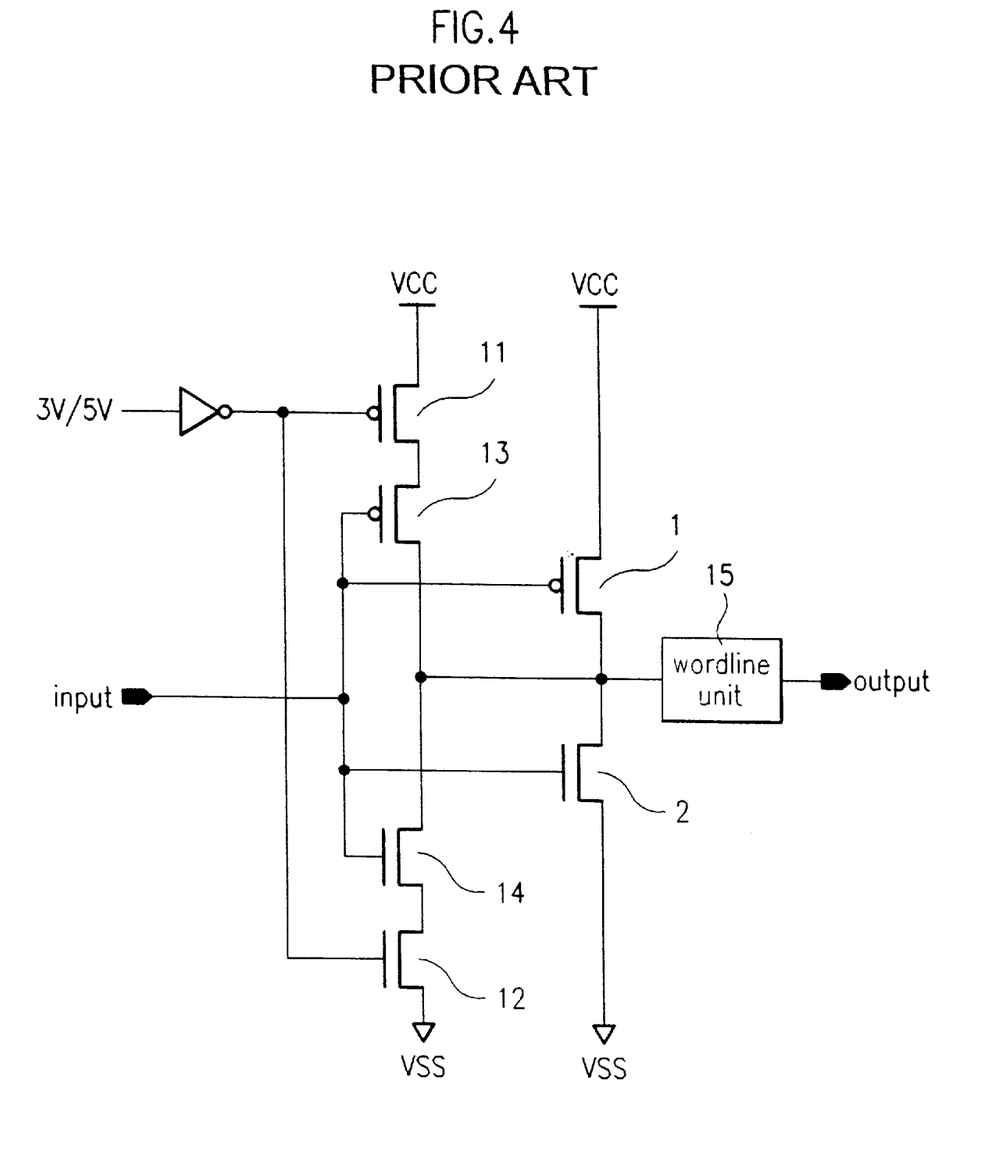
FIG. 4 illustrates a first exemplary related art input buffer circuit.
Figure 5:
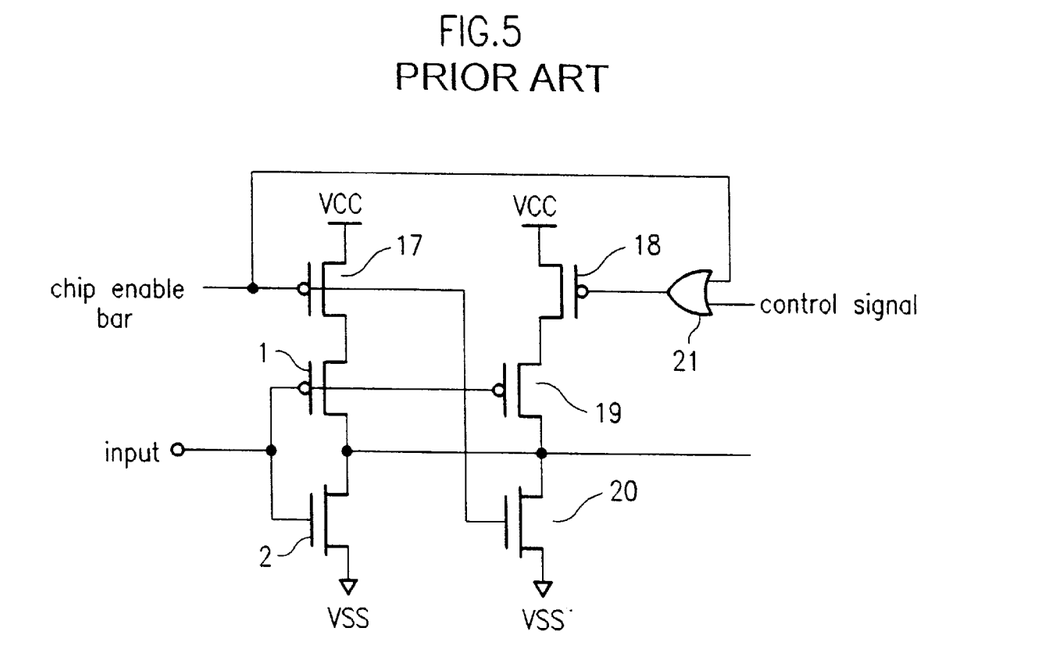
FIG. 5 illustrates a second exemplary related art input buffer circuit.
Figure 6:
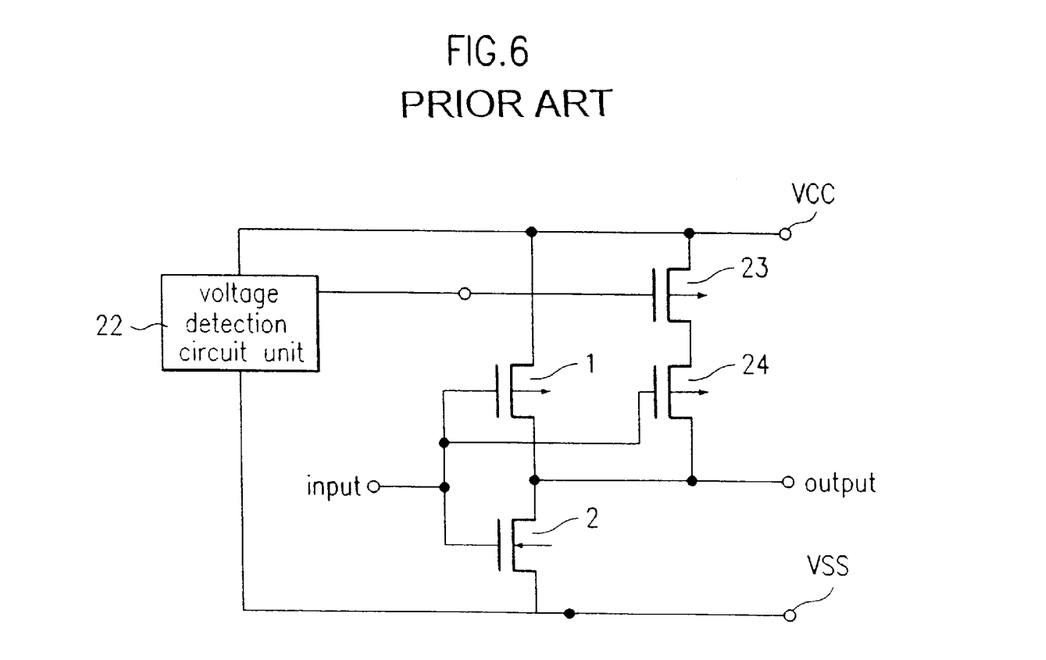
FIG. 6 illustrates a third exemplary related art input buffer circuit.

FIG. 1 illustrates a diagram showing a related background art input buffer circuit. FIG. 2 illustrates a graph showing a DC characteristic of an output voltage in response to an input voltage of an input buffer circuit designed for a VCC of 3.0 V. FIG. 3 illustrates a graph showing a DC characteristic of an output voltage in response to an input voltage of an input buffer circuit designed for a VCC of 5.0 V. FIG. 4 illustrates a first exemplary related art input buffer circuit. FIG. 5 illustrates a second exemplary related art input buffer circuit. FIG. 6 illustrates a third exemplary related art input buffer circuit.

Initially, referring to FIG. 1, the input buffer circuit is provided with a first PMOS transistor 11 and a first NMOS transistor 12. Outputs from the first PMOS transistor 11 and the first NMOS transistor 12 are forwarded to outside of the input buffer circuit through two first inverters 13. Gates of the first PMOS transistor 11 and the first NMOS transistor 12 are connected to an input terminal 14 to the input buffer circuit in common. Drains of the first PMOS transistor 11 and the first NMOS transistor 12 are connected to the first inverters 13 in common. A source of the first PMOS transistor 11 is connected to a power source voltage VCC, and a source of the first NMOS transistor 12 is connected to a ground voltage VSS. The input buffer circuit shown in FIG. 1 receives 0.8 V~2.2 V of TTL (Transistor Transistor Logic) and provides 0 V~5 V of CMOS output voltage when VCC is 5 V. When VCC is 3 V, it provides 0 V~3 V of CMOS output voltage.

However, as shown in FIG. 2, because a threshold voltage Vth of the input buffer circuit is set to be 1.5 V when VCC is 3.0 V, the input buffer circuit provides an appropriate Vhi (Local High Input Range)/Vli(Local Low Input Range) tolerance at 3.0 V. In general, the Vth of the input buffer circuit increases when VCC increases whereas the Vth of the input buffer circuit decreases when the VCC decreases in the case where the VCC is 5.0 V. Thus, the Vth of the input buffer circuit is changed to about 2.7 V with a reduced Vhi/Vli tolerance smaller than the case of VCC of 3.0 V. As a result, it is difficult to use the input buffer circuit when VCC is 5.0 V.

In FIG. 3, the Vth of the input buffer circuit is set to be 1.5 V when the VCC is 5.0 V, so that an appropriate Vhi/Vli tolerance can be obtained at 5.0 V. However, when the VCC is dropped to 3.0 V, the Vth also decreases to about 1.0 V. Thus, a reduced Vhi/Vli tolerance becomes smaller than the case of VCC of 5.0 V. As a result, the input buffer circuit can not be used at VCC of 3.0 V.

FIG. 4 is the first exemplary input buffer circuit for improving the problems of the related background art input buffer circuit as shown in FIG. 1. The input buffer circuit in FIG. 4 is provided with a second PMOS transistor 42, a second NMOS transistor 46, a third PMOS transistor 43 and a third NMOS transistor 45, an input buffer unit and a wordline unit 47 in addition to a first PMOS transistor 41 and a first NMOS transistor 44. An output of the input buffer circuit is forwarded to outside of the input buffer circuit through the wordline unit 47. Gates of the second PMOS transistor 42 and the second NMOS transistor 46 are commonly connected to an output inverted 3 V or 5 V, a source of the second PMOS transistor 42 to VCC, a source of the second NMOS transistor 46 to VSS. Drains of the third PMOS transistor 43 and the third NMOS transistor 45 are connected to each other while gates of the first PMOS transistor 41 and the first NMOS transistor 44, both in the input buffer unit, and the third PMOS transistor 43 and the third NMOS transistor 45 are connected to an input voltage of the input buffer circuit in common. A source of the third PMOS transistor 43 is connected to a drain of the second PMOS transistor 42, and a source of the third NMOS transistor 45 is connected to a drain of the second NMOS transistor 46. A source of the first PMOS transistor 41 is connected to VCC, and a source of the first NMOS transistor 44 is connected to VSS.

The wordline unit 47 is connected to a common drain of the first PMOS transistor 41 and the first NMOS transistor 44 as well as to a common drain of the third PMOS 43 and the third NMOS 45. Since either the third PMOS 43 or the third NMOS 45 is added to the first exemplary related art input buffer circuit depending on a VCC change(3.0 V or 5.0 V), the first exemplary related art input buffer circuit can be used when VCC is 5.0 V in the case of FIG. 2 as well as when VCC is 3.0 V in the case of FIG. 3. That is, because the Vth of the input buffer circuit increases when VCC increases, by adding an NMOS an increase of the Vth of the input buffer circuit can be suppressed. Similarly, the Vth of the input buffer circuit decreases when VCC decreases. Thus, by adding the PMOS, a decrease of the Vth of the input buffer circuit can be suppressed. As a result, the input buffer circuit has been designed to have a fixed Vth for a VCC change.

Referring to FIG. 5, the second exemplary input buffer circuit is provided with an input buffer unit, a second PMOS transistor 53 and a third PMOS transistor 54, a fourth PMOS 55 and a second NMOS 56, and an OR gate 57. An output of the input buffer circuit is forwarded to outside of the input buffer circuit through a common drain of the first PMOS transistor 51 and the first NMOS transistor 52 in the input buffer unit and a common drain of the fourth PMOS transistor 55 and the second NMOS transistor 56. Gates of the first PMOS transistor 51 and the first NMOS transistor 52 in the input buffer unit are connected to an input voltage to the input buffer circuit in common as well as to a gate of the fourth PMOS transistor 55. A source of the first PMOS transistor 51 is connected to a drain of the second PMOS transistor 53, and a source of the first NMOS transistor 52 is connected to VSS.

A gate of the second PMOS transistor 53 is connected to a chip-enable bar signal as well as to a gate of the second NMOS transistor 56 and one of input terminals of the OR gate 57 in common. A source of the second PMOS transistor 53 is connected to VCC. The third PMOS transistor 54 has a gate connected to an output terminal of the OR gate 57, a source connected to VCC, and a drain connected to a source of the fourth PMOS transistors 55. A drain of the fourth PMOS transistor 55 is connected to a drain of the second NMOS transistor 56. A source of the second NMOS transistor 56 is connected to VSS. The other input terminal of the OR gate 57 is connected to a control signal. Since the aforementioned second exemplary related art input buffer circuit regulates the control signal connected to one input terminal of the OR gate 57 in response to a VCC change(3.0 V or 5.0 V), by adding the fourth PMOS transistor 55, the second exemplary related art input buffer circuit can be used even at 5.0 V of VCC in the case of FIG. 2 and even at 3.0 V of VCC in the case of FIG. 3.

Referring to FIG. 6, the third exemplary related art input buffer circuit is provided with a voltage detection circuit unit 63, a second PMOS transistor 64, an third PMOS transistor 65 in addition to a first PMOS transistor 61 and a first NMOS transistor 62. An output of the input buffer circuit is forwarded outside of the input buffer circuit through a common drain of the first PMOS transistor 61 and the first NMOS transistor 62 in the input buffer unit. The voltage detection circuit unit 63 is connected to both VCC and VSS, for providing an output voltage thereof to a gate of the second PMOS transistor 64. The second PMOS transistor 64 has a source connected to VCC and a drain connected to a source of the third PMOS transistor 65. The third PMOS transistor 65 has a drain connected to an output terminal of the input buffer circuit and a gate commonly connected to an input terminal to the input buffer circuit as well as to gates of the first PMOS transistor 61 and the first NMOS transistor 62 in the input buffer unit. A source of the first PMOS transistor 61 in the input buffer unit is connected to VCC, and a source of the first NMOS transistor 62 in the input buffer unit is connected to VSS. Since the aforementioned third exemplary related art input buffer circuit detects a VCC change (3.0 V or 5.0 V) in the voltage detection circuit unit 63 by adding the third PMOS transistor 65, the third exemplary related art input buffer circuit can be used even at 5.0 V of the VCC in the case of FIG. 2 and even at 3.0 V of the VCC in the case of FIG. 3.

As described above, a PMOS transistor or NMOS transistor is added to provide a fixed Vth for a VCC change in the foregoing related art input buffer circuits. Nonetheless, it can not have a fixed Vth effectively for the VCC change because a size of a gate width of an MOS in the input buffer circuit is not changed.

SUMMARY OF THE INVENTION

Accordingly, the present invention is directed to an input buffer circuit that substantially obviates one or more of the problems due to limitations and disadvantages of the related art.

An object of the present invention is to provide a semiconductor device having an improved input buffer circuit by maintaining a fixed Vth effectively for a VCC change.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an input buffer circuit includes an input buffer circuit for a semiconductor device comprising a first input buffer unit having first and second transistors, a second input buffer unit coupled to the first buffer unit, the second input buffer having third and fourth transistors, a control unit for activating one of the first and second input buffer units, and a switching unit having fifth, sixth, and seventh transistors and couped to the control unit, wherein the fifth transistor is turned off and the sixth and seventh transistors are turned on when the second unit is activated.

In another aspect of the present invention, an input includes an input buffer circuit for a semiconductor device includes a first input buffer unit having a first PMOS transistor and a first NMOS transistor, the first NMOS transistor being coupled to the first PMOS transistor and an input of the input buffer circuit, a second input buffer unit having a second PMOS transistor and a second NMOS transistor, the third PMOS transistor being coupled to the first PMOS transistor and an output of the input buffer circuit, a third NMOS transistor coupled to the second PMOS transistor and the input of the input beffer circuit, a third PMOS transistor coupled to the second PMOS transistor and a VCC, a third NMOS transistor coupled to i:he first NMOS transistor and a VSS, a fourth NMOS transistor coupled to the second NMOS transistor and the VSS, a first converter connecting the third NMOS transistor and the fourth NMOS transistor, and a control unit for activating one of the first and second input buffer units.

In a further aspect of the present invention, an input includes an input buffer circuit for a semiconductor device includes a first input buffer unit having a first PMOS transistor and a first NMOS transistor, the first NMOS transistor being coupled to the first PMOS transistor and an input of the input buffer circuit, a second input buffer unit having a second PMOS transistor and a second NMOS transistor, the second PMOS transistor being coupled to the first PMOS transistor and an output of the input buffer circuit, a third NMOS transistor coupled to the second PMOS transistor and the input of the input buffer circuit, a third PMOS transistor coupled to the first PMOS transistor and a VCC, a fourth NMOS transistor coupled to the second NMOS transistor and a VSS, a fourth PMOS transistor coupled to the second PMOS transistor and the VCC, a first converter connecting the third PMOS transistor and the fourth PMOS transistor, and a control unit for activating one of the first and second input buffer units and coupled to the fourth PMOS transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 7:
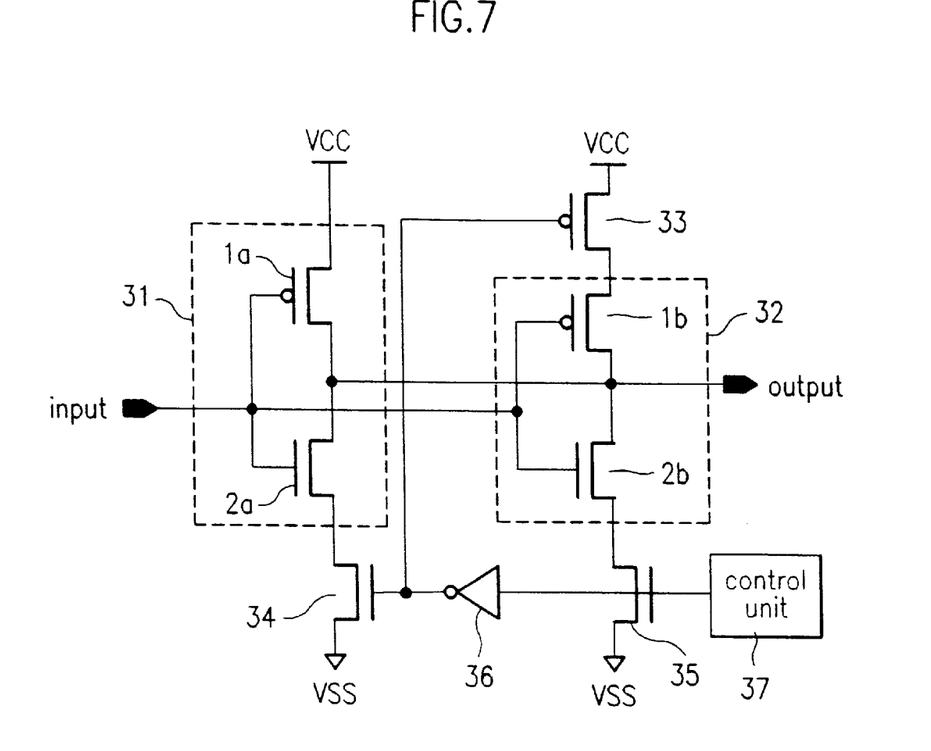
FIG. 7 illustrates a schematic circuit diagram showing an input buffer circuit in accordance with a first embodiment of the present invention.

Referring to FIG. 7, the input buffer circuit in accordance with a first embodiment of the present invention includes first and second input buffer units 71 and 72 respectively having a first PMOS transistor 1a and a first NMOS transistor 2a, and a second PMOS transistor 1b and a second NMOS transistor 2b, a third PMOS transistor 73, third and fourth NMOS transistors 74 and 75, a first inverter 76, and a control unit 77. An output of the input buffer circuit is forwarded to outside of the input buffer circuit through a common drain of the first PMOS transistor 1a and the first NMOS transistor 2a in the first input buffer unit 71 and a common drain of the second PMOS transistor 1b and the second NMOS transistor 2b in the second input buffer unit 72.

The third PMOS transistor 73 and the third and fourth NMOS transistors 74 and 75 act as selection switches. The first NMOS transistor 2a has a gate width W greater than that of the second NMOS transistor 2b (W/n, where 'n' is a real numeral greater than unity). Gates of both the first PMOS transistor 1a and the first NMOS transistor 2a in the first buffer unit 71 and the second PMOS transistor 1b and the second NMOS transistor 2b in the second input buffer 72 are commonly connected to an input terminal on the input buffer circuit. A source of the first PMOS transistor 1a is connected to VCC, a source of the first NMOS transistor 2a is connected to a drain of the third NMOS transistor 74. A gate of the third NMOS transistor 74 is connected to an output of the control unit 77 inverted by the first inverter 76 as well as to a gate of the third PMOS transistor 73 in common. A source of the third NMOS transistor 74 is connected to VSS. A source of the second PMOS transistor 1b is connected to a drain of the third PMOS transistor 73, while a source of the second NMOS transistor 2b is connected to a drain of the fourth NMOS transistor 75. A source of the third PMOS transistor 73 is connected to VCC and a gate of the fourth NMOS transistor 75 is connected to an output of the control unit 77. A source of the fourth NMOS transistor 75 is connected to VSS.

Figure 8:
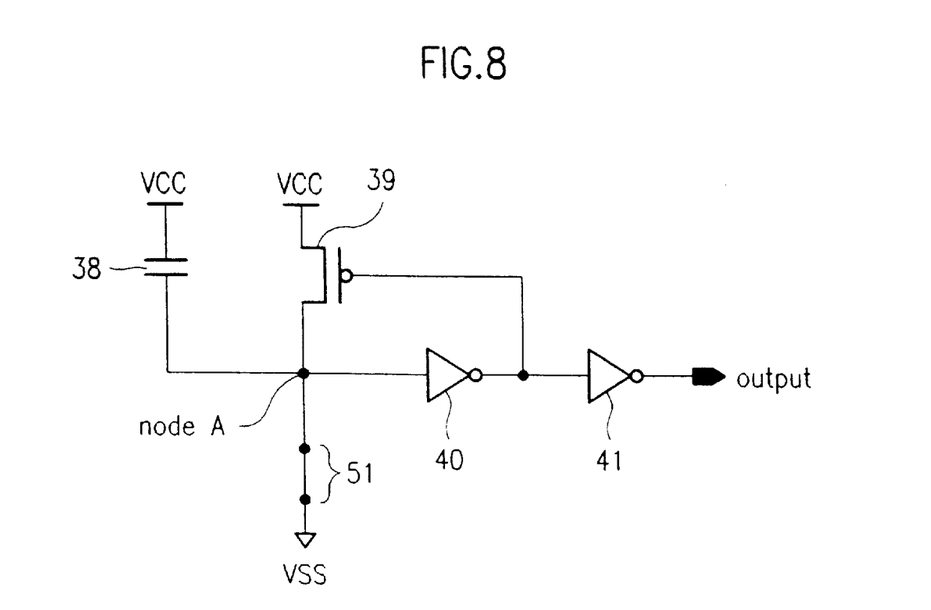
FIG. 8 illustrates a schematic circuit showing a control unit in the input buffer circuit in accordance with the first embodiment of the present invention.

Referring to FIG. 8, the control unit 77 of FIG. 7 using a fuse option includes a capacitor 81, a fourth PMOS transistor 82, second and third inverters 83 and 84, and a fuse 85 to provide a high or low signal depending on breakage of the fuse 85. The capacitor 81 is connected to a drain of the fourth PMOS transistor 82 and VCC. The fourth PMOS transistor 82 has a source connected to VCC, a drain connected to a node A at the cross of the capacitor 81, the second inverter 83 and VSS, and a gate connected to an output of the node A inverted by the first inverter 83. The output of the node A is forwarded to outside of the control unit 77 through the second and third inverters 83 and 84.

Operation of the control unit 77 of FIG. 8 will be explained as follows.

When VCC is 5.0 V, the fuse 85 is not broken to provide VSS with the node A. Thus, a low signal is transmitted outside of the control unit 77 through the second and third inverters 83 and 84, so that the fourth PMOS transistor 82 is turned off due to a high signal from the second inverter 83. Conversely, when VCC is 3.0 V, the fuse 85 is broken, so that the node A increases to a VCC level due to a charge coupling of the capacitor 81. Thus, a high signal is transmitted to outside of the control unit 77 through the second and third inverters 83 and 84, so that the fourth PMOS transistor 82 is turned on due to a low signal from the second inverter 83. As a result, the node A is accurately maintained at the VCC level. Alternatively, instead of the fuse option, the control unit 77 may be provided with a mask option, voltage monitoring option, bonding option, or resistor option, for obtaining the similar result.

Operation of the aforementioned input buffer circuit of the present invention will be explained with reference to FIGS. 7, 8, 9, and 10.

Figure 9:
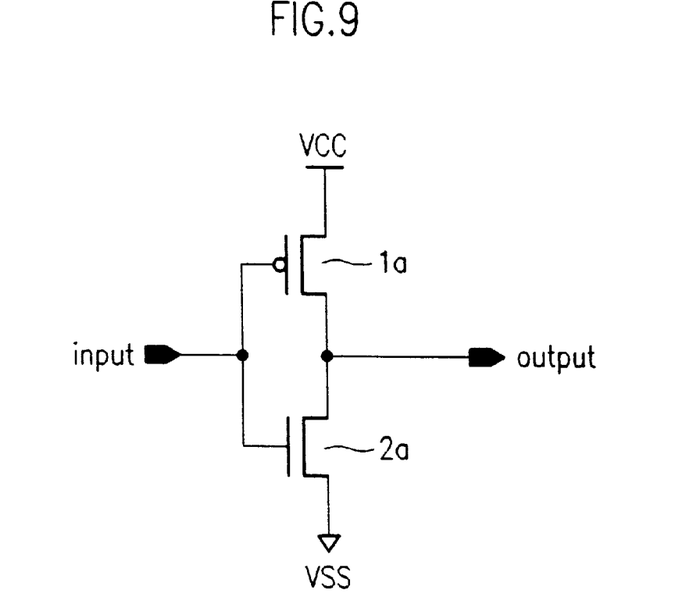
FIG. 9 illustrates a schematic circuit diagram showing an input buffer circuit with the third PMOS transistor turned off in accordance with the first embodiment of the present invention.

When VCC is 5.0 V, the control unit provides a low signal to turn off the third PMOS transistor 73 and the fourth NMOS transistor 75 and to turn on the third NMOS transistor 74, as shown in FIG. 9. Therefore, a Vth of the input buffer circuit is influenced only by the first PMOS transistor 1a and the first NMOS transistor 2a in the first input buffer 71. In this instance, gate widths of the first PMOS transistor 1a and the first NMOS transistor 2a in the first input buffer unit 71 are adjusted, so that the input buffer circuit has the output DC characteristic in response to the input as shown in FIG. 3. Thus, the Vth becomes about 1.5 V when VCC is 5.0 V.

Figure 10:
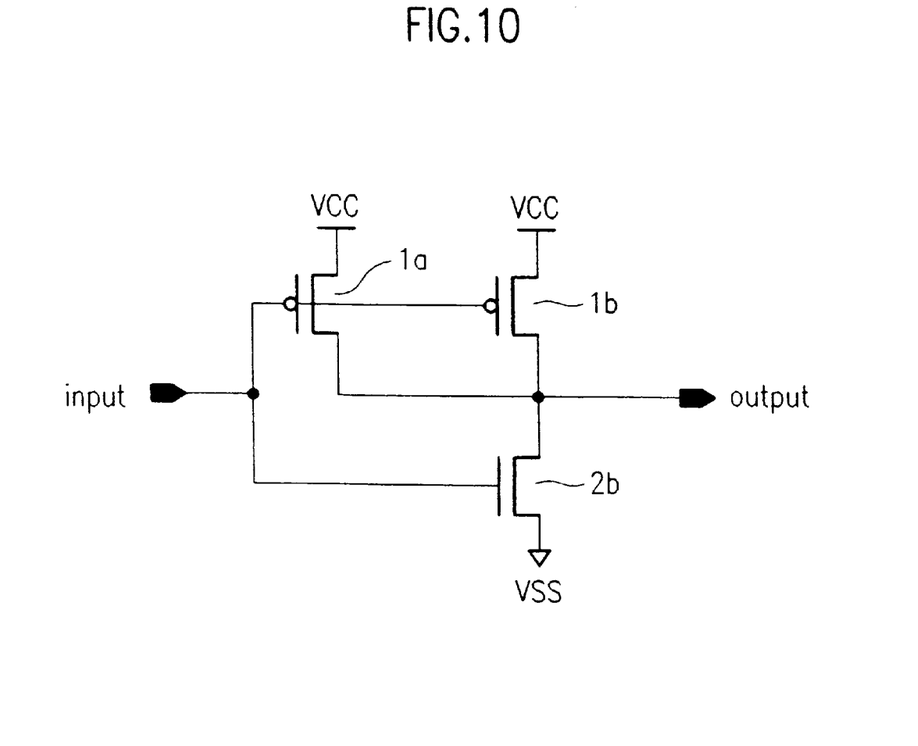
FIG. 10 illustrates a schematic circuit diagram showing an input buffer circuit with the third NMOS transistor turned off in accordance with the first embodiment of the present invention.

On the other hand, when VCC is 3.0 V, the control unit 77 provides a high signal to turn on the third PMOS transistor 73 and the fourth NMOS transistor 75 and to turn off the third NMOS transistor 74, as shown in FIG. 10. The Vth of the input buffer circuit is thus influenced only by the second PMOS transistor 1b and the second NMOS transistor 2b in the second input buffer unit 72. Thus, when VCC drops, as shown in FIG. 2, the Vth of the input buffer circuit also drops. Thus, by adding the first PMOS transistor 1a, a gate width of the PMOS transistor is increased. In addition, the second NMOS transistor 2b having a gate width smaller than the first NMOS transistor 2a is used for reducing the gate width of the NMOS transistor to maintain the Vth of 1.5 V at 3.0 V of VCC.

Figure 11:
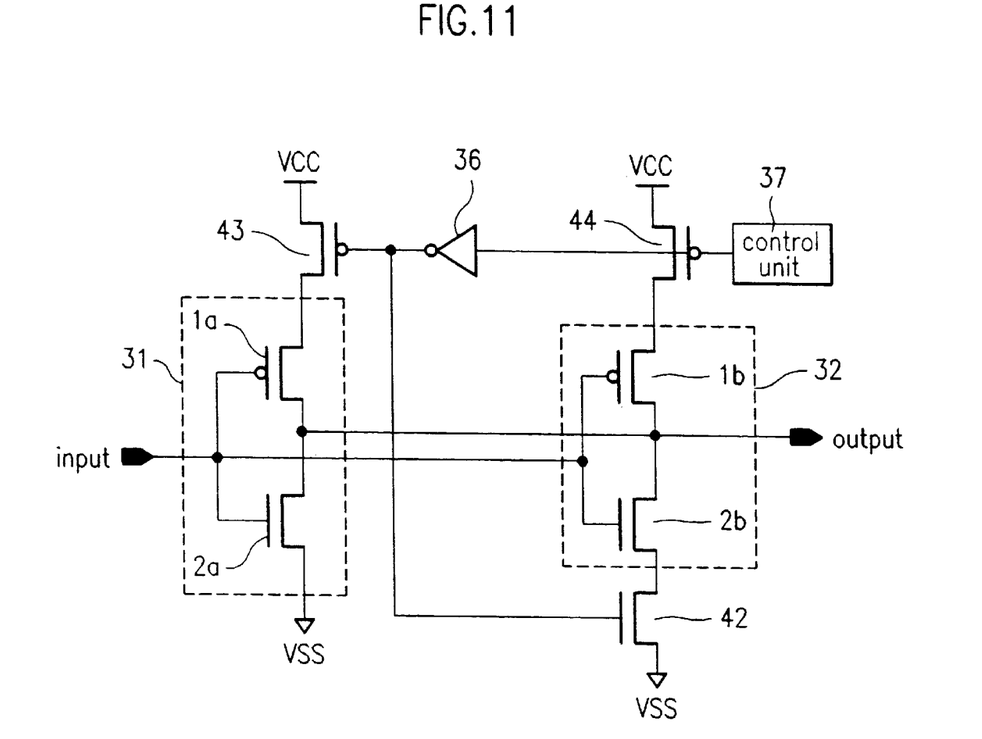
FIG. 11 illustrates a schematic circuit diagram showing an input buffer circuit in accordance with a second embodiment of the present invention; and, FIG. 12 illustrates a schematic circuit diagram showing an input buffer circuit with the a fifth PMOS transistor turned off in accordance with the first embodiment of the present invention.

Referring to FIG. 11, the input buffer circuit in accordance with a second embodiment of the present invention includes first and second input buffer units 91 and 92 respectively having a first PMOS transistor 1a and a first NMOS transistor 2a and a second PMOS transistor 1b and a second NMOS transistor 2b, a fifth NMOS transistor 93, fifth and sixth PMOS transistor 94 and 95, a first inverter 96, and a control unit 97. An output of the input buffer circuit is transmitted to outside of the input buffer circuit through a common drain of the first PMOS transistor 1a and a first NMOS transistor 2a in the first input buffer unit 91 and a common drain of the second PMOS transistor 1b and the second NMOS transistor 2b in the second input buffer unit 92. The fifth NMOS transistor 93 and the fifth and sixth PMOS transistors 94 and 95 act as switches, and the first PMOS transistor 1a has a gate width greater than a gate width (W/n, where 'n' is a real number greater than unity) of the second PMOS transistor 1b. Gates of the first PMOS transistor 1a and the first NMOS transistor 2a in the first input buffer unit 91 are commonly connected to an input terminal on the input buffer circuit as well as to gates of the second PMOS transistor 1b and the second NMOS transistor 2b in the second input buffer 92. A source of the first NMOS transistor 2a is connected to VSS. A source of the first PMOS transistor 1a is connected to a drain of the fifth PMOS transistor 94. A gate of the fifth PMOS transistor 94 is commonly connected to an output of the control unit 97 inverted by the first inverter 96 and a gate of the fifth NMOS transistor 93. A source of the fifth PMOS transistor 94 is connected to VCC. A source of the second PMOS transistor 1b is connected to a drain of the sixth PMOS transistor 95 while a source of the second NMOS transistor 2b is connected to a drain of the fifth NMOS transistor 93. A source of the fifth NMOS transistor 93 is connected to VSS. The sixth PMOS transistor 95 has a gate connected to an output terminal of the control unit 97 and a source connected to VCC.

Operation of the aforementioned input buffer circuit of the present invention will be explained with reference to FIGS. 11 and 12.

When VCC is 3.0 V, the control unit 97 provides a high signal to turn off the fifth NMOS transistor 93 and the sixth PMOS transistor 95 and to turn on the fifth PMOS transistor 94, as shown in FIG. 9. The Vth of the input buffer circuit is influenced only by the first PMOS transistor 1a and the first NMOS transistor 2a in the first input buffer unit 91. In this instance, gate widths of the first PMOS transistor 1a and the first NMOS transistor 2a in the first input buffer 91 are adjusted, so that the input buffer circuit of the present invention has an output DC characteristic in response to an input as shown in FIG. 2. Thus, the Vth becomes about 1.5 V at VCC of 3.0 V.

Figure 12:
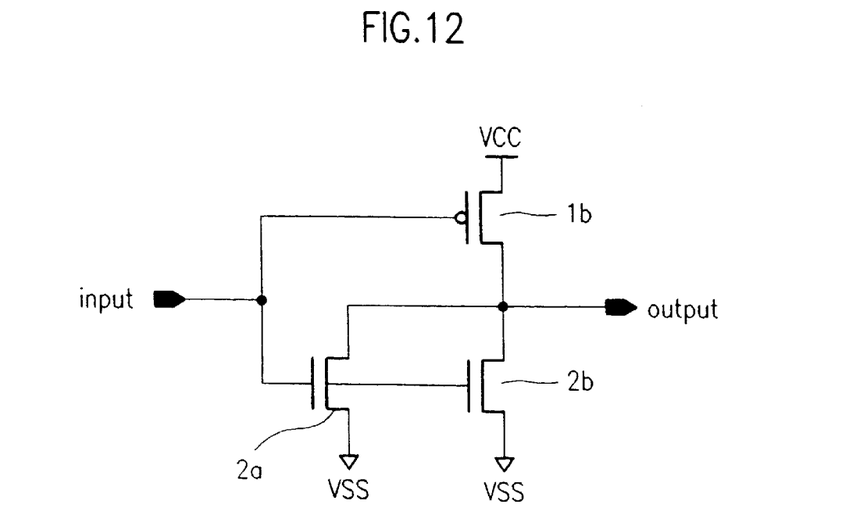

When VCC is 5.0 V, the control unit 97 provides a low signal to turn on the fifth NMOS transistor 93 and the sixth PMOS transistor 95 and to turn off the fifth PMOS transistor 94, as shown in FIG. 12. Thus, the Vth of the input buffer circuit is influenced only by the second PMOS transistor 1b and the second NMOS transistor 2b in the second input buffer unit 92. Thus, when VCC increases as shown in FIG. 3, the Vth of the input buffer circuit also increases. By adding the first NMOS transistor 2a, a gate width of the NMOS transistor can be increased. In addition, the second PMOS transistor 1b having a gate width smaller than the first PMOS transistor 1a is used for reducing the gate width of the PMOS transistor, thereby maintaining 1.5 V of Vth at VCC of 5.0 V.

As described above, the input buffer circuit of the present invention is provided with two input buffer units having different gate widths, with or without a PMOS transistor and/or an NMOS transistor, and a control unit for selecting one of the input buffer units. Therefore, the input buffer circuit of the present invention effectively maintaining a fixed Vth with regard to variation of VCC by adding an additional PMOS transistor or NMOS transistor as well as changing a size of the input buffer circuit itself, thereby improving a reliability of the circuit.

It will be apparent to those skilled in the art that various modifications and variations can be made in the semiconductor device having an improved input buffer circuit of the present invention without departing from the spirit or scope of the invention. Thus, it is intended that the present invention cover the modifications and variations of this invention provided they come within the scope of the appended claims and their equivalents.

What is claimed is:

1. An input buffer circuit for a semiconductor device, comprising:
    a first input buffer unit having first and second transistors;
    a second input buffer unit coupled to the first input buffer unit, the second input buffer unit having third and fourth transistors;
    a control unit for activating one of the first and second input buffer units; and
    a switching unit having fifth, sixth, and seventh transistor and coupled to the control unit, wherein the sixth transistor has a source directly connected to a VSS, a drain directly connected to a source of the second transistor, and a gate directly connected to and inverted output of the control unit.

2. The input buffer circuit according to claim 1, wherein the sixth and seventh transistors have a conductivity type different from the first transistor.

3. The input buffer circuit according to claim 1, further comprising a first inverter coupled to the sixth and fifth transistors.

4. The input buffer circuit according to claim 1, wherein the second transistor has a gate width greater than the fourth transistor.

5. The input buffer circuit according to claim 1, wherein the first, third, and fifth transistors have the same conductivity type.

6. The input buffer circuit according to claim 1, wherein the second, fourth, sixth, and seventh transistors have the same conductivity type.

7. The input buffer circuit according to claim 1, wherein each of the first and second transistors has a drain connected to each other, a gate connected to an input terminal of the input buffer circuit.

8. The input buffer circuit according to claim 1, wherein each of the third and fourth transistors has a drain connected to each other, and a gate connected to an input terminal of the input buffer circuit.

9. The input buffer circuit according to claim 1, wherein the fifth transistor has a source connected to a VCC, a drain connected to a source of the third transistor, and a gate connected to an inverted output of the control unit.

10. The input buffer circuit according to claim 1, wherein the seventh transistor has a source connected to a VSS, a drain connected to a source of the fourth transistor, and a gate connected to an output of the control unit.

11. The input buffer circuit according to claim 1, wherein the control unit includes;
    a capacitor connected to a VCC,
    an eighth transistor has a drain connected to the capacitor and a source connected to the VCC,
    a fuse connecting the drain of the eighth transistor and a VSS,
    a second inverter connected to a gate of the eighth transistor for inverting outputs from the capacitor, the eighth transistor, and the fuse, and a third inverter for inverting an output of the second inverter and transmitting to an output of the input buffer circuit.

12. The input buffer circuit according to claim 1, wherein the sixth transistor is turned off and the fifth and seventh transistors are turned on when the control unit provides a high signal.

13. An input buffer circuit for a semiconductor device, comprising:

a first input buffer unit having a first PMOS transistor and a first NMOS transistor, the first NMOS transistor being coupled to the first PMOS transistor and an input of the input buffer circuit;

a second input buffer unit having a second PMOS transistor and a second NMOS transistor, the second PMOS transistor being coupled to the first PMOS transistor and an output of the input buffer circuit;

a third PMOS transistor coupled to the second PMOS transistor and a VCC;

a third NMOS transistor coupled to the first NMOS transistor and a VSS;

a fourth NMOS transistor coupled to the second NMOS transistor and the VSS;

a first inverter connecting the third NMOS transistor and the fourth NMOS transistor; and a control unit for activating one of the first and second input buffer units.

14. The input buffer circuit according to claim 13, wherein the third NMOS transistor is turned off and the third PMOS transistor and the fourth NMOS transistor are turned on when the control unit provides a high signal.

15. The input buffer circuit according to claim 13, wherein the control unit includes;

a capacitor connected to the VCC, a fourth PMOS transistor having a drain connected to the capacitor and a source connected to the VCC, a fuse connecting the drain of the fourth PMOS transistor and the VSS, a second inverter connected to a gate of the fourth PMOS transistor for inverting outputs, from the capacitor, the fourth PMOS transistor, and the fuse, and a third inverter for inverting an output of the second inverter and transmitting to an output of the input buffer circuit.

16. The input buffer circuit according to claim 13, wherein the first NMOS transistor has a gate width greater than the second NMOS transistor.

17. An input buffer circuit for a semiconductor device, comprising:

a first input buffer unit having a first PMOS transistor and a first NMOS transistor, the first NMOS transistor being coupled to the first PMOS transistor and an input of the input buffer circuit;

a second input buffer unit having a second PMOS transistor and a second NMOS transistor, the second PMOS transistor being coupled to the first PMOS transistor and an output of the input buffer circuit;

the second NMOS transistor coupled to the second PMOS transistor and the input of the input buffer circuit;

a third PMOS transistor coupled to the first PMOS transistor and a VCC;

a third NMOS transistor coupled to the second NMOS transistor and a VSS, wherein a drain of the third NMOS transistor is directly connected to a source of the second NMOS transistor;

a fourth PMOS transistor coupled to the second PMOS transistor and the VCC;

a first inverter connecting the third PMOS transistor and the fourth PMOS transistor; and a control unit for activating one of the first and second input buffer units and coupled to the fourth PMOS transistor.

18. The input buffer circuit according to claim 17, wherein the third NMOS transistor and the fourth PMOS transistor are turned on and the third PMOS transistor is turned off when the control unit provides a high signal.

19. The input buffer circuit according to claim 17, wherein the first PMOS transistor has a gate width greater than the second PMOS transistor.

* * * * *